(12) United States Patent
Barth

(10) Patent No.: US 12,372,129 B2
(45) Date of Patent: Jul. 29, 2025

(54) STRUCTURED BRAKE DISK

(71) Applicant: Oerlikon Surface Solutions AG, Pfäffikon, Pfäffikon (CH)

(72) Inventor: Alexander Barth, Dresden (DE)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 655 days.

(21) Appl. No.: 17/433,539

(22) PCT Filed: Feb. 17, 2020

(86) PCT No.: PCT/EP2020/054125
§ 371 (c)(1),
(2) Date: Aug. 24, 2021

(87) PCT Pub. No.: WO2020/169541
PCT Pub. Date: Aug. 27, 2020

(65) Prior Publication Data
US 2022/0154792 A1    May 19, 2022

(30) Foreign Application Priority Data
Feb. 24, 2019  (DE) .......................... 102019001286.0

(51) Int. Cl.
*F16D 65/12*   (2006.01)
*C23C 4/02*    (2006.01)
*C23C 14/02*   (2006.01)
*F16D 65/02*   (2006.01)

(52) U.S. Cl.
CPC .............. *F16D 65/127* (2013.01); *C23C 4/02* (2013.01); *C23C 14/028* (2013.01); *F16D 2065/1308* (2013.01); *F16D 2065/132* (2013.01); *F16D 2250/0046* (2013.01)

(58) Field of Classification Search
CPC ......... C23C 4/02; C23C 14/028; F16D 65/12; F16D 65/127; F16D 2065/132; F16D 2065/1356
See application file for complete search history.

(56) References Cited

U.S. PATENT DOCUMENTS

| | | | |
|---|---|---|---|
| 6,253,883 B1 * | 7/2001 | Wakisaka | F16D 65/10 188/18 R |
| 6,290,032 B1 | 9/2001 | Patrick et al. | |
| 2004/0031652 A1 * | 2/2004 | Khambekar | F16D 65/127 188/218 XL |
| 2005/0064146 A1 * | 3/2005 | Hollis | C23C 14/028 428/167 |
| 2012/0058363 A1 * | 3/2012 | Verpoort | C23C 4/08 428/650 |

(Continued)

FOREIGN PATENT DOCUMENTS

| | | |
|---|---|---|
| DE | 102009003161 A1 | 11/2010 |
| DE | 102010052735 A1 | 11/2011 |

(Continued)

*Primary Examiner* — Bradley T King

(57) ABSTRACT

A brake disk with a surface which is structured in order to increase the adhesion of a coating on the surface, wherein the structuring of the surface comprises at least one recess, the depth of which decreases as the depth of the recess increases wherein the at least one recess has the shape of a spiral structure.

19 Claims, 1 Drawing Sheet

(56) References Cited

U.S. PATENT DOCUMENTS

Figure 1:
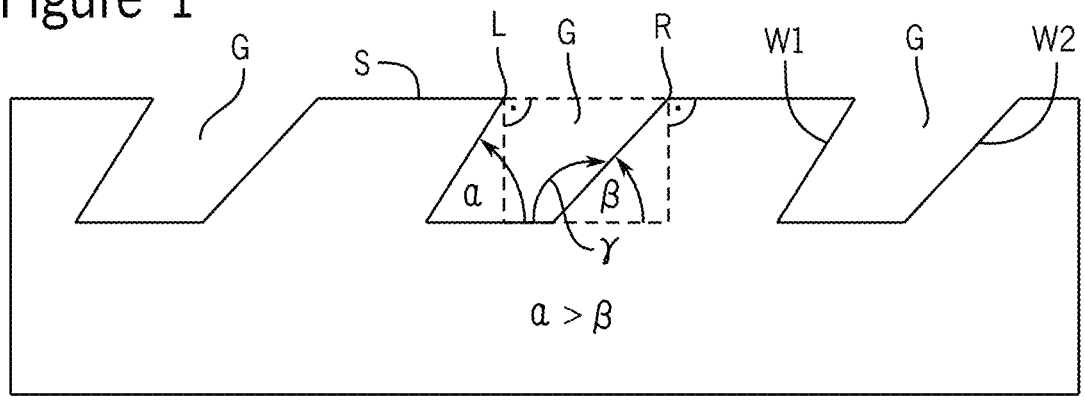

| | | | | |
|---|---|---|---|---|
| 2013/0047947 A1* | 2/2013 | Whitbeck | ............... | B21H 7/18 |
| | | | | 123/193.2 |
| 2014/0000996 A1* | 1/2014 | Schoepf | ............... | F16D 65/127 |
| | | | | 188/218 XL |
| 2016/0178019 A1* | 6/2016 | Stephenson | ........... | F16D 65/127 |
| | | | | 188/218 XL |
| 2018/0141136 A1* | 5/2018 | Agapiou | ................ | C23C 4/131 |
| 2019/0119802 A1* | 4/2019 | Suidzu | ...................... | C23C 4/02 |
| 2022/0065313 A1* | 3/2022 | Carminati | ............ | F16D 65/127 |
| 2023/0018275 A1* | 1/2023 | Giammarinaro | ...... | F16D 65/123 |

FOREIGN PATENT DOCUMENTS

| | | | | |
|---|---|---|---|---|
| DE | 102010064350 A1 | 7/2012 | | |
| DE | 102010064354 A1 | 7/2012 | | |
| DE | 102016210225 A1 | 12/2017 | | |
| EP | 1854903 A1 * | 11/2007 | ........... | B08B 7/0042 |
| WO | 0238978 A1 | 5/2002 | | |

\* cited by examiner

STRUCTURED BRAKE DISK

The present invention relates to a brake disk with a treated surface, in particular a brake disk in which a coating is applied to the surface in order to increase the adhesion. The expert calls this process "activation of the surface", which ultimately represents a structuring.

STATE OF THE ART

DE102010064350A1 proposes a brake disk and a method for treating the surface of the brake disk, wherein, in order to increase the adhesion of the coating on the surface, the surface is roughened by making at least one recess in the surface, the width of which increases as the depth of the recess increases and by means of this undercut a positive connection between the brake disk and the coating is created.

For this purpose, the cutting tool has at least two cutting edges, the two cutting edges being at an angle of inclination to the perpendicular of the workpiece surface and both cutting edges simultaneously forming a common plane in the orthogonal direction. The aim is to create an exactly reproducible surface activation in order to apply surface coatings with the lowest possible fluctuations in the process parameters on the activated surfaces.

According to the prior art, the surface has a structuring, the structuring comprising at least one recess, the width of which increases as the depth of the recess increases. In the prior art it is described that this makes it possible to produce a positive connection between a coating to be applied subsequently and the workpiece, the positive connection having an exact reproducibility.

Furthermore, according to this prior art, it is advantageous that the at least one recess is in the form of a spiral recess, similar to the groove on a record. This makes it possible to carry out the surface activation by machining material, in particular a turning process, whereby the surface activation can be carried out very quickly and inexpensively.

However, the corresponding structuring with a recess, the width of which increases as the depth of the recess increases, has the serious disadvantage that during subsequent coating the geometry results in shadowing effects. This means that with increasing depth in the recess, the coating thickness decreases dramatically, leading to a strong reduction of the adhesion-improving effect. This is a problem in particular in coating processes such as plasma vaporization and deposition from the gas phase (PVD process), in which the coating particles fly in a straight line from the material source to the substrate. The same applies to thermal spraying.

There is therefore a need to provide a structuring in which, on the one hand, a coating has a toothing ensured by an undercut and, on the other hand, the coating can be reached into the structure, which does not suffer from the shadowing in the same way as the approach given by the prior art using a broadening deepening.

According to the invention, the object is achieved by a brake disk according to claim 1. According to the prior art, the brake disk has at least one recess in the form of a spiral recess.

In contrast to the prior art, however, the width of the recess does not increase with increasing depth, but rather decreases. According to the invention, a recess is realized with a first recess wall and a second recess wall. One of the two recess walls, for example the first recess wall, is designed as a recess wall that undercuts relative to the surface to be coated. In contrast, the other recess wall, for example the second recess wall, is not designed as an undercutting recess wall. The width of the recess decreases as the depth of the recess increases. Accordingly, there is no shadowing during the coating in the area of the other, non-undercutting wall of the recess.

The invention will now be explained in detail by way of example with reference to FIG. 1. FIG. 1 shows schematically a section of a brake disk 1 to be coated according to the invention. This brake disk has a structured surface S to be coated with a trench G. The trench G can also be referred to as a recess. The trench G is a spiral-shaped recess milled into the surface S of the brake disk with a first recess wall W1 and a second recess wall W2. A virtual rectangle is also drawn in with a corner L at the corner L formed by the recess wall W1 and the surface S and a further corner R at the corner R formed by the recess wall W2 and the surface S. The height of the virtual rectangle corresponds to the depth of the trench. The virtual rectangle and the recess wall W1 form an angle $\alpha$ which defines the steepness of the overhanging recess wall W1 and thus the undercut. The virtual rectangle and the recess wall W2 form an angle $\beta$ which defines the steepness of the (non-overhanging) recess wall W2. According to the invention, the geometry of the recess is selected such that $\alpha > \beta$ applies, because then it is ensured that the width of the recess decreases with increasing depth.

Figure 2:
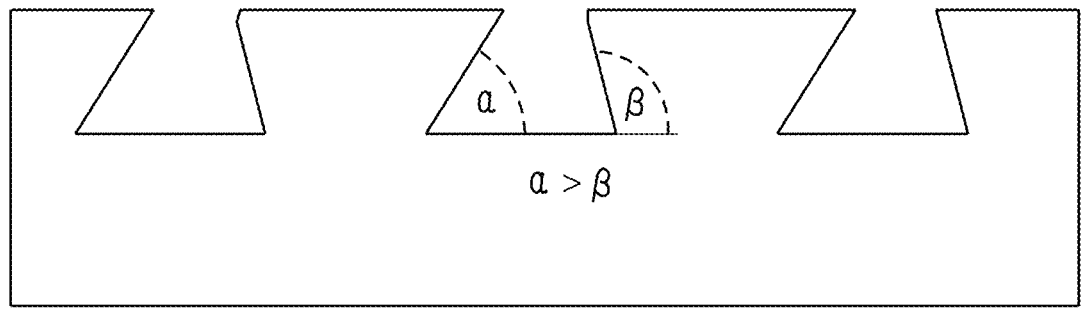

In contrast, FIG. 2 shows a recess according to the prior art, in which $\alpha < \beta$ applies and thus the width of the recess increases with increasing depth.

Figure 3:
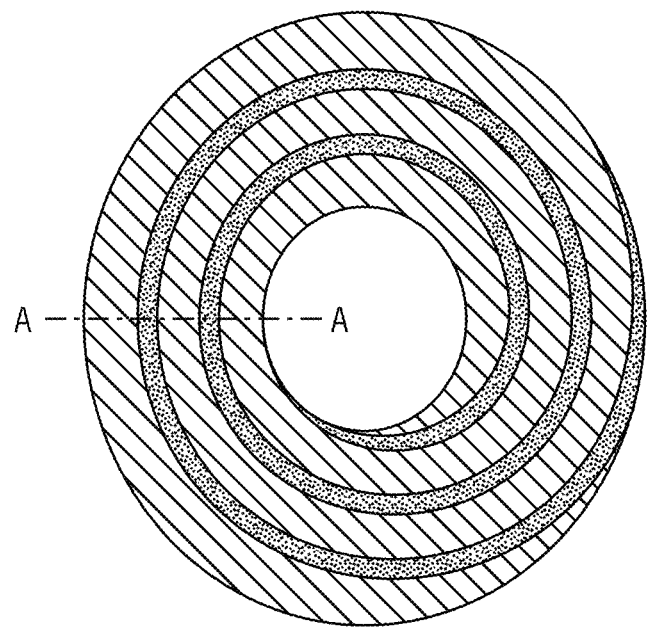

FIG. 3 shows schematically the top view of a brake disk with a spiral recess. According to the invention, the coated brake disk 1 has a surface S, the surface S having a groove-shaped trench G, as can be seen clearly in FIG. 1. The groove-shaped trench G comprises a first recess wall W1, a second recess wall W2 and a groove base N. The groove-shaped trench G has a width B measured approximately in parallel to the surface S from the first recess wall W1 to the second recess wall W2 and a depth T measured approximately orthogonally to the surface S from the surface S to the groove base N. The width B decreases from the surface S towards the groove base T. This has the advantage that, in particular, the second recess wall W2 can be coated very well during the coating process/method, since the coating particles have free access to the second recess wall W2. At the same time it is ensured that the undercut of the trench required to increase the permanent adhesion of the coating is given. In the prior art according to FIG. 2, however, both recess walls are in the shadow of the coating and can only be coated poorly.

In the exemplary embodiment according to FIG. 1 it can be clearly seen that the second angle $\gamma$ measured from the groove base G to the second recess wall W2 is greater than 90°, in particular between 90° and 180°, preferably 135°, in particular it is an obtuse angle. It can also be clearly seen that the first angle $\alpha$ measured from the groove base G to the first recess wall W1 is less than 90°, in particular between 0° and 90°, preferably 55°, in particular it is an acute angle. The supplementary angle $\beta$ which complements the second angle $\gamma$ is smaller than the first angle $\alpha$, the second angle $\gamma$ and the supplementary angle $\beta$ adding up to 180°. The groove-shaped trench G has a trapezoidal cross-section, wherein in particular one of the two recess walls W1, W2, in particular the first recess wall W1, in particular the second recess wall W2, and particularly advantageously, as shown in the exemplary embodiment according to FIG. 1, both recess walls W1, W2 are even. The even design is relatively easy to produce, especially if the trench G is milled. In a further exemplary embodiment, it can be useful for the walls W1, W2 to be uneven, for example to have a section-wise circular, elliptical, parabolic, hyperbolic or similar profile. However, it is essential that the width B of the trench G decreases in the direction from the surface S to the groove base N, in particular decreases continuously. It can be useful for the width B of the trench G to be constant in sections. It is particularly advantageous that the width B of the trench G on the surface S is greater than the width B of the trench G on the groove base N.

In the exemplary embodiment according to FIG. 1, the groove base N is even and runs in particular approximately parallel to the surface S. In a further exemplary embodiment, the groove base N can have a section-wise circular, elliptical, parabolic, hyperbolic or similar profile.

The depth T is smaller than the smallest width B of the trench G, the smallest width B in particular representing the width of the groove base N, in particular the ratio of the depth T to the smallest width B being approximately 0.85. The ratio is advantageously in a range from approximately 0.5 to approximately 0.99, in particular from approximately 0.7 to approximately 0.95, advantageously from approximately 0.8 to approximately 0.9.

The depth T of the trench G is approximately between 10 μm and 1000 μm. As can be clearly seen in FIG. 3, the coated brake disk 1 is advantageously characterized by the fact that the trench G runs approximately in a spiral shape on the surface S of the brake disk 1. The center of the spiral lies approximately in the center M of the circular brake disk 1, the radius of the spiral in particular decreasing towards the center M of the brake disk 1.

In an exemplary embodiment, a method for coating a brake disk is shown below, the brake disk 1 having the trench G being coated by means of a plasma vapor process, in particular a PVD process, or by means of thermal spraying. In the coating process, the coating particles flying approximately in a straight line from the coating source onto the brake disk 1 hit the surface S of the brake disk 1 approximately orthogonally. Small deviations from orthogonality can also occur. However, it is essential that the coating particles flying onto the brake disk 1 have direct access to at least one of the two recess walls W1, W2, in particular to the second recess wall W2, so that this second recess wall W2 can be coated well. Before coating the brake disk 1 it is useful to embed, in particular mill, scratch or cut the trench G into the surface of the brake disk.

The invention claimed is:

1. A brake disk with a surface which is structured in order to increase adhesion of a coating on the surface, wherein a structuring of the surface comprises at least one groove-shaped recess having a trapezoidal cross-section, a width of which decreases as a depth of the recess increases, wherein the groove-shaped recess has a first recess wall, a second recess wall and a groove base, wherein the grooved-shaped recess has a width measured approximately in parallel to the surface from the first recess wall to the second recess wall and a depth measured approximately orthogonally to the surface from the surface to the groove base, wherein the width decreases from the surface towards the groove base, wherein a second angle measured from the groove base to the second recess wall is greater than 90°, wherein a first angle measured from the groove base to the first recess wall is less than 90°, and wherein the at least one recess has a shape of a spiral structure.

2. The coated brake disk according to claim 1, wherein a supplementary angle supplementing the second angle is smaller than the first angle, and wherein the second angle and the supplementary angle together add up to 180°.

3. The coated brake disk according to claim 1, wherein at least one of the two recess walls are even.

4. The coated brake disk according to claim 1, wherein the groove base is even, and runs approximately parallel to the surface.

5. The coated brake disk according to claim 1, wherein the depth is smaller than a smallest width of the recess, wherein the smallest width represents the width of the groove base, and a ratio of depth to smallest width is approximately 0.85.

6. The coated brake disk according to claim 1, wherein the depth is approximately between 10 μm and 1000 μm.

7. The coated brake disk according to claim 1, wherein the recess on the surface of the brake disk runs approximately in a spiral, wherein a center of the spiral is approximately in a center of the circular brake disk, and wherein a radius of the spiral decreases towards the center of the brake disk.

8. A method for coating the brake disk according to claim 1, comprising coating the brake disk having the recess using a plasma vapour process or thermal spraying.

9. The method according to claim 8, wherein coating particles flying approximately in a straight line from a coating source onto the brake disk hit the surface of the brake disk approximately orthogonally.

10. The method according to claim 8, wherein, before the brake disk is coated, the recess is embedded by being cut into the surface of the brake disk.

11. A brake disk with a surface which is structured in order to increase adhesion of a coating on the surface, wherein a structuring of the surface comprises at least one groove-shaped recess, a width of which decreases as a depth of the recess increases, wherein the groove-shaped recess has a first recess wall, a second recess wall and a groove base, wherein the grooved-shaped recess has a width measured approximately in parallel to the surface from the first recess wall to the second recess wall and a depth measured approximately orthogonally to the surface from the surface to the groove base, wherein the width decreases from the surface towards the groove base, wherein a second angle measured from the groove base to the second recess wall is greater than 90°, wherein a first angle measured from the groove base to the first recess wall is less than 90°, wherein the groove base is even and runs approximately parallel to the surface, and wherein the at least one recess has a shape of a spiral structure.

12. The coated brake disk according to claim 11, wherein a supplementary angle supplementing the second angle is smaller than the first angle, and wherein the second angle and the supplementary angle together add up to 180°.

13. The coated brake disk according to claim 11, wherein at least one of the two recess walls are even.

14. The coated brake disk according to claim 11, wherein the depth is smaller than a smallest width of the recess, wherein the smallest width represents the width of the groove base, and a ratio of depth to smallest width is approximately 0.85.

15. The coated brake disk according to claim 11, wherein the depth is approximately between 10 μm and 1000 μm.

16. The coated brake disk according to claim 11, wherein the recess on the surface of the brake disk runs approximately in a spiral, wherein a center of the spiral is approximately in a center of the circular brake disk, and wherein a radius of the spiral decreases towards the center of the brake disk.

17. A method for coating the brake disk according to claim 11, comprising coating the brake disk having the recess using a plasma vapour process or thermal spraying.

18. The method according to claim 17, wherein coating particles flying approximately in a straight line from a coating source onto the brake disk hit the surface of the brake disk approximately orthogonally.

19. The method according to claim 17, wherein, before the brake disk is coated, the recess is embedded by being cut into the surface of the brake disk.

\* \* \* \* \*